United States Patent [19]

Apeldoorn et al.

[11] 4,157,569
[45] Jun. 5, 1979

[54] TELEVISION RECEIVER HAVING A SYNCHRONOUS DETECTION CIRCUIT AND A FREQUENCY DEVIATION-DETECTION CIRCUIT TO ACHIEVE A WIDE FREQUENCY RANGE CONTROL FUNCTION

[75] Inventors: Hans J. Apeldoorn; Peter J. H. Janssen, both of Eindhoven, Netherlands

[73] Assignee: U.S. Philips Corporation, New York, N.Y.

[21] Appl. No.: 825,575

[22] Filed: Aug. 18, 1977

[30] Foreign Application Priority Data

Sep. 17, 1976 [NL] Netherlands ............... 7610354

[51] Int. Cl.² .............. H04N 5/14; H04N 5/44; H04N 5/52
[52] U.S. Cl. .................. 358/160; 358/188; 358/174
[58] Field of Search ............ 358/160, 188, 191, 195, 358/198, 21, 23, 24, 174; 325/397–400, 404, 405, 408, 409, 417, 418, 423, 421

[56] References Cited

U.S. PATENT DOCUMENTS

| | | | |
|---|---|---|---|
| 2,573,248 | 10/1951 | Cotsworth | 325/405 X |
| 3,562,416 | 2/1971 | Krover | 358/174 X |
| 3,812,289 | 5/1974 | Avins | 358/160 X |
| 3,858,000 | 12/1974 | Merriweather et al. | 358/195 |
| 3,922,483 | 11/1975 | Indri | 358/195 |
| 3,962,533 | 6/1976 | Von Nikelsberg | 358/191 |
| 4,091,410 | 5/1978 | Citta | 325/421 X |

*Primary Examiner*—Richard Murray
*Assistant Examiner*—Aristotelis M. Psitos
*Attorney, Agent, or Firm*—Thomas A. Broidy; William J. Streeter; Henry I. Steckler

[57] ABSTRACT

In a television receiver having a synchronous video signal detector from which a signal is obtained for controlling a function such as an automatic volume control or a synchronization signal separation, a correction signal, obtained by means of full-wave rectification from a frequency deviation detector, is added to the signal to improve the operation of said function of the receiver in the case of more serious detuning.

5 Claims, 1 Drawing Figure

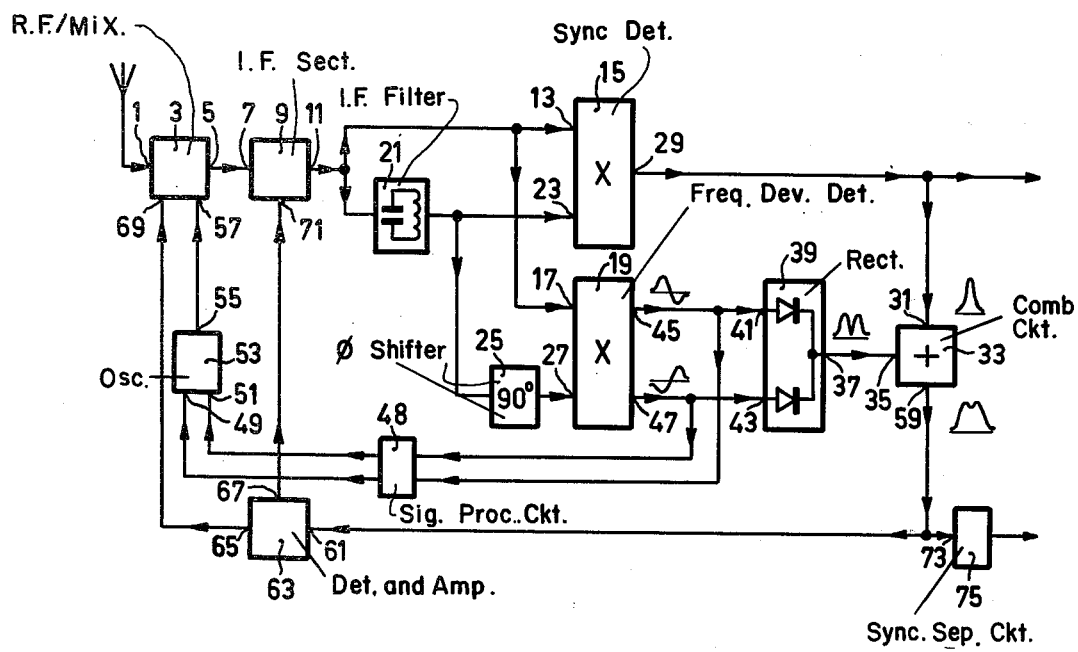

TELEVISION RECEIVER HAVING A SYNCHRONOUS DETECTION CIRCUIT AND A FREQUENCY DEVIATION-DETECTION CIRCUIT TO ACHIEVE A WIDE FREQUENCY RANGE CONTROL FUNCTION

The invention relates to a television receiver having a synchronous detection circuit and a frequency deviation-detection circuit wherein a reference signal path of the synchronous detection circuit includes a filter tuned to the picture intermediate frequency and wherein a signal for controlling a function of the receiver is obtained from an output of the synchronous detection circuit.

Mullard Technical Communications No. 117, January 1973 pages 223-231 discloses a television receiver of the above-mentioned type wherein the frequency deviation detection circuit attends to an automatic tuning correction.

It is an object of the invention to provide an improvement of the operation of one or more functions such as the automatic volume control and/or the synchronization signal separation in a television receiver having a synchronous detection circuit.

In accordance with the invention a television receiver of the type mentioned in the preamble is therefore characterized in that the receiver comprises a combining circuit coupled to an output of the synchronous detection circuit and furthermore through a rectifier circuit, to the frequency deviation detection circuit for adding a correction signal to the signal for controlling the function so that this function becomes operative over a wider frequency range than without the addition of the correction signal.

This measure enables the use of a filter having a high quality factor in the reference signal path of the synchronous detection circuit without the frequency range in which the automatic volume control and/or the synchronization signal separation of the receiver still operates satisfactorily, becoming too small.

It should be noted that U.S. Pat. No. 3,696,301 discloses a F.M. receiver in which a combination of signals originating from an amplitude detector and a frequency detector is used for tuning indication. As a result, however, the tuning indication function of the receiver becomes operative over a smaller frequency range.

The invention will now be explained with reference to the drawing which comprises one FIGURE only.

The FIGURE illustrates on the basis of a simplified block diagram a portion of a television receiver according to the invention.

In the FIGURE a received signal is applied to an input 1 of a high-frequency and mixer section 3 of the television receiver. This signal is converted into an intermediate frequency signal which becomes available at an output 5 and which is applied to an input 7 of an intermediate frequency section 9.

An amplified intermediate frequency signal is derived from an output 11 of the intermediate frequency section 9 and applied to a first input 13 of a synchronous detection circuit 15 and to a first input 17 of a frequency deviation-detection circuit 19 and, furthermore, through a filter 21 tuned to the picture intermediate frequency to a reference signal input 23 of the synchronous detection circuit 15 and through the filter 21 and a 90° phase-shifting network 25 to a further input 27 of the frequency deviation detector 19 which operates as a phase detector.

From an output 29 of the synchronous detection circuit 15 a detected television signal is obtained which can be processed and displayed in the receiver. In addition, this video signal is applied to a first input 31 of a combining circuit 33. A video signal originating from an output 37 of a full-wave rectifier circuit 39 which has two inputs 41, 43 to which signals are applied which are derived from two outputs 45, 47 of the frequency deviation detector 19 and which are of the opposite polarity relative to a reference level are applied to a second input 35 of the combining circuit 33.

The signals originating from the outputs 45 and 47 of the frequency deviation detection circuit 19 are furthermore applied to two frequency control signal inputs 49, 51 of an oscillator 53 via a signal processing circuit 48. An output 55 of this oscillator 53 is connected to an oscillator signal input 57 of the high frequency and mixer circuit 3. In the signal processing circuit 48 the video signals originating from the outputs 45, 47 of the frequency deviation detection circuit 19 are converted into suitable D.C. voltages or currents. The output signals of the AFC detector 19 are push-pull video signals of which the amplitude and polarity depend upon the deviation of the tuning of the local oscillator 53 from its correct tuning. The amplitude and polarity of these signals can be transferred into corresponding D.C. signals by sample and hold circuits which sample at the moments that the sampled video signal shows a reference level representing its amplitude and polarity like the top synch levels or the porch levels.

The curve of the video signals produced at the output 29 of the synchronous detection circuit 15 which represents the amplitude as a function of the frequency to which the receiver is tuned and which is shown in the drawing near the input 31 of the combination circuit 33 is very narrow owing to the influence of the phase characteristic of the filter 21. This filter 21 should preferably have a highest possible circuit quality to obtain the best possible synchronous detection.

From the outputs 45 and 47 of the frequency deviation detection circuit 19 video signals are obtained whose amplitude as a function of the frequency is shown above these outputs 45, 47. The rectifier circuit 39 combines the positive portions of these curves and delivers at its output 37 a video signal whose amplitude depends on the frequency as shown in the curve shown above the output 37 and whose polarity relative to the above-mentioned reference level remains the same. An advantageous combination of the input signals of the combining circuit 33 is obtained if at the output 59 thereof the amplitude of the component produced by the signal at the input 35 is approximately once or twice as great as that produced by the signal at the input 31.

In the combining circuit 33 the video signals supplied to the inputs 31 and 35 are combined, for example by means of adding, to a new video signal which is delivered at an output 59 and which has an amplitude as a function of the frequency as shown in a curve near this output 59. This curve is widened under the influence of the signal at the input 35, which is a correction signal, relative to that of the signal produced at the input 31 to which the correction signal has not yet been added.

The function control signal originating from the output 59 of the combination circuit 33 is applied to an input 61 of a detection and amplifier circuit 63 wherein control signals which are used for an automatic volume control of the receiver are derived from a signal section having a constant level, for example the level during the synchronization pulses or during the black porch. These signals appear at two outputs 65, 67 and are supplied to control signal inputs 69, 71 of the high frequency section 3 and the intermediate frequency section 9.

The automatic volume control of the receiver obtained in this manner operates over a wider frequency range than without the above-mentioned addition of the correction signal so that a slight detuning of the receiver no longer results in overdriving several signal paths.

The signal originating from the output 59 of the combining circuit 33 is furthermore applied to an input 73 of a synchronization signal separation circuit 75 which becomes consequently operative over a wider frequency range than if the combining circuit 33 would not have been used.

It will be clear that if so desired one of the said functions may, for example, be controlled in a customary manner.

In this embodiment the combining circuit 33 is included in a section of the receiver where video signals are present, so before a detection circuit converts the signal into a D.C. voltage or current by means of which the automatic volume control must be effected. It is of course also possible to include such detection circuits before the combining circuit 33. This means that in general a greater number of smoothing components will be necessary. Then the combining circuit 33 must combine direct currents or voltages and cannot, in that case, attend to controlling a synchronization signal separation circuit.

The combining circuit 33 can be constructed as an adding circuit, or in the case one of the input signals is of another polarity, as a subtracting circuit, having passive and/or active components and may, if so desired, comprise one or more threshold circuits.

It is possible that the shape of the curve of the signal at the output 59 of the combining circuit 33 is not only influenced by threshold circuits but also a choice of the amplitude ratio between the signals at the inputs 31 and 35.

The rectifier circuit 39 may comprise diodes but may also be implemented by means of transistors. If so desired one of the signal paths of this rectifier circuit may include an attenuation or amplification to obtain a correction or a disturbance of the symmetry of the characteristic of this circuit.

If the frequency deviation detection circuit produces only one output signal, this signal can be inverted by means of an amplifier so that the input signal and the output signal of that amplifier can supply the correction signal through a full-wave rectifier circuit.

What is claimed is:

1. A circuit for use in a television receiver having an intermediate frequency signal, said circuit comprising a filter tuned to said intermediate frequency, a synchronous detector having an input coupled to said filter and an output, a frequency deviation detector having an input coupled to receive said intermediate frequency signal and at least one output, a rectifier having an input coupled to said deviation detector output and an output, and a combining circuit having a pair of inputs coupled to said rectifier and synchronous detector outputs respectively and an output means for supplying a function control signal to the receiver; whereby the control of said function is operative for a wide frequency range.

2. A circuit as claimed in claim 1, further comprising an automatic volume control circuit coupled to said output means.

3. A circuit as claimed in claim 1, further comprising a synchronization signal separation circuit coupled to said output means.

4. A circuit as claimed in claim 1, wherein said frequency deviation detector comprises a phase detector having an input coupled to said filter.

5. A circuit as claimed in claim 1, wherein said deviation detector comprises a pair of opposite polarity outputs and said rectifier comprises a full wave rectifier having a pair of inputs coupled to said deviation detector outputs respectively.

* * * * *